United States Patent [19]

Sommer

[11] Patent Number: 5,256,913
[45] Date of Patent: Oct. 26, 1993

[54] LOW POWER OPTOELECTRONIC DEVICE AND METHOD

[75] Inventor: René Sommer, Prilly, Switzerland

[73] Assignee: Logitech, Inc., Redwood City, Calif.

[21] Appl. No.: 717,187

[22] Filed: Jun. 18, 1991

Related U.S. Application Data

[63] Continuation of Ser. No. 580,359, Sep. 10, 1990, abandoned, which is a continuation of Ser. No. 357,653, May 25, 1989, abandoned, which is a continuation of Ser. No. 83,511, Aug. 7, 1987, abandoned.

[51] Int. Cl.$^5$ .................. H03K 17/78; H03K 3/42
[52] U.S. Cl. .................. 307/311; 250/208.4; 307/491
[58] Field of Search .................. 307/311, 491; 250/214 R, 578, 208.4

[56] References Cited

FOREIGN PATENT DOCUMENTS 32088  3/1979  Japan .................. 307/311

OTHER PUBLICATIONS

L.A. Davidson et al, "Variable Delay in Light-Emitting Diodes", IBM Tech. Dis. Bulletin vol. 9, No. 3 Aug. 1966 p. 325.

A. Nielsen, "Matched Optical Couplers Stabilize Isolation Circuit" Electronics May 15, 1975 pp. 98–99.

*Primary Examiner*—John Zazworsky
*Attorney, Agent, or Firm*—James E. Eakin

[57] ABSTRACT

Methods and devices are disclosed for selectively varying the load to a photodetector such as a phototransistor which forms part of a photosource/photodetector pair and for selectively using to advantage or compensating for the parasitic capacitance of the photodetector to permit reductions in power, conversion of fixed signal thresholds to software controlled digital hysteresis, automatic adjustment and compensation for unmatched photosources and associated photodetectors, and adjustment of fixed voltage thresholds.

2 Claims, 7 Drawing Sheets

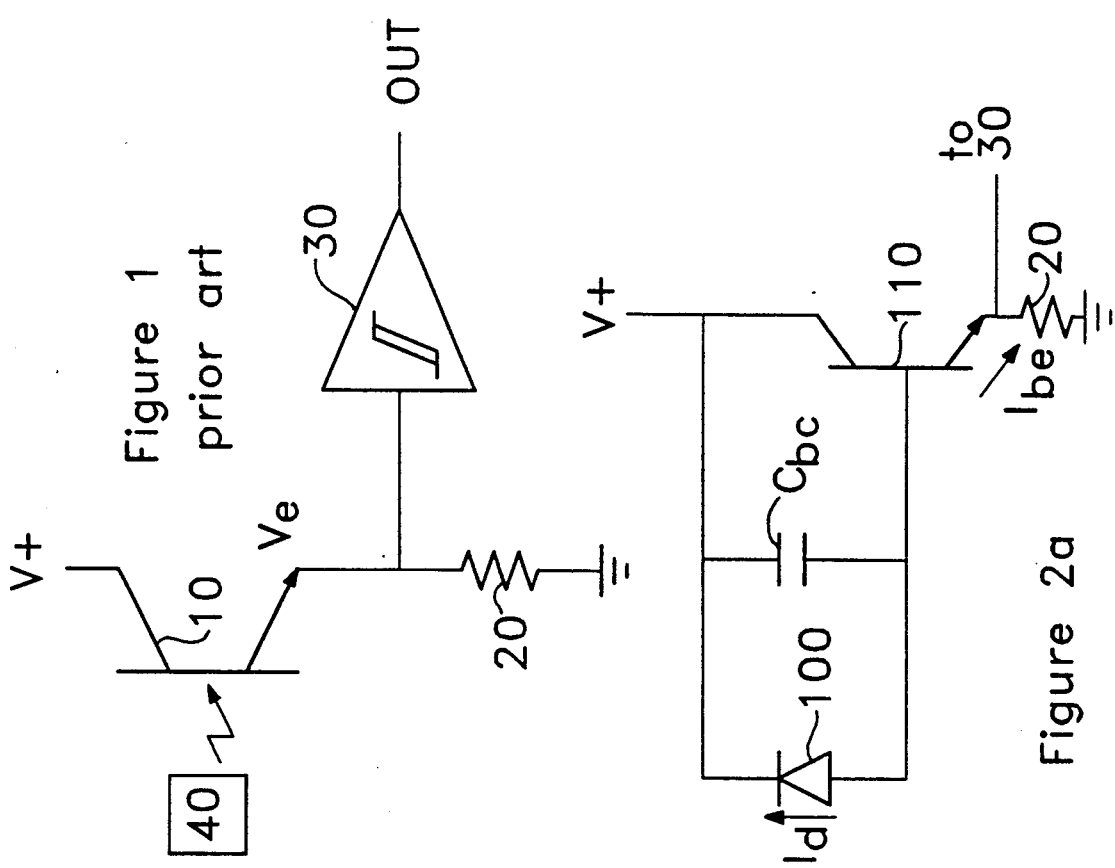

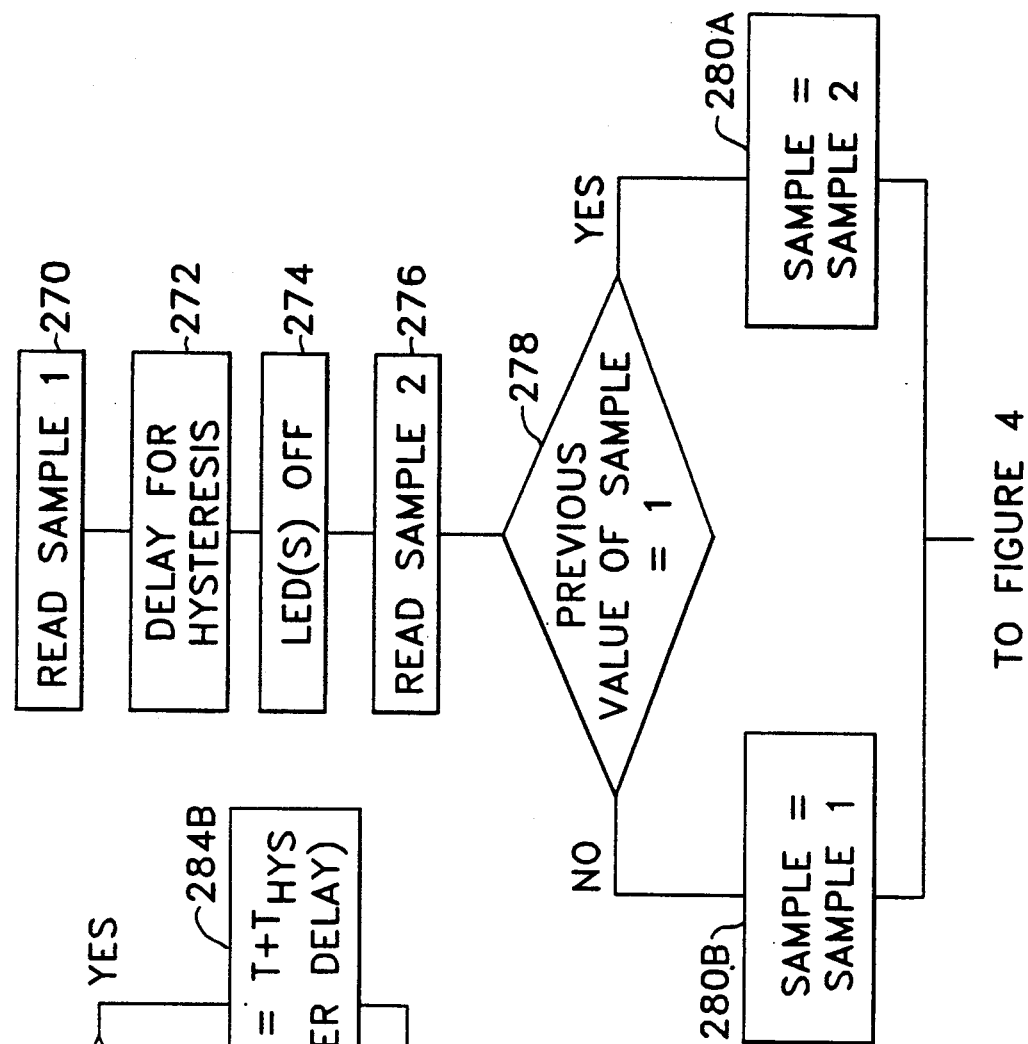
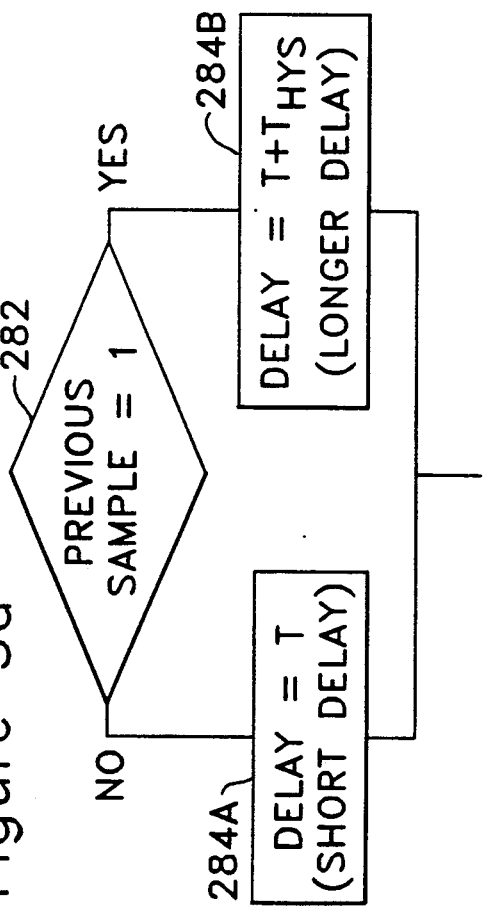

LOW POWER OPTOELECTRONIC DEVICE AND METHOD

This application is a continuation of application Ser. No. 07/580,359, filed Sep. 10, 1990, abandoned, which is a continuation of application Ser. No. 07/357,653, filed May 25, 1989, abandoned, which is a continuation of application Ser. No. 07/083,511, filed Aug. 7, 1987, abandoned.

FIELD OF THE INVENTION

The present invention relates generally to photodetection circuits, and particularly to low power photodetection circuits using LED and phototransistor pairs. The device and method are particularly, though not exclusively, suited for use with single chip microprocessors, such as might be used in electronic mice.

BACKGROUND OF THE INVENTION

Photodetection circuits are used in a wide variety of applications. One very common application is the detection of movement of an object relative to some reference. In such systems, a mask and perhaps other components such as a scale are interposed between an LED or other light source and a photosensor such as a phototransistor. The mask or shutter, which may be a rotating disk, typically includes alternating opaque and transparent segments and is driven by the movement of the object being tracked. The rotation of the disk causes the light from the LED to alternately reach and be blocked from the photodetector. The movement of the object is thus converted to a crudely digitized signal from the photodetector.

To create a better defined digital signal, such as is required for use with the microprocessors used in some devices, the output of the photodetector is typically fed to a logic gate which exhibits some hysteresis. This is most commonly accomplished by using a gate with a Schmitt trigger input and a threshold voltage $V_{th}$.

In many applications, the power drain of an LED/phototransistor pair can be substantial, so that power reductions are desirable. One application where power reductions are useful is an electronic mouse. One technique for reducing the power consumed by the optoelectronic device is to pulse the LED selectively.

While pulsing the LED helps to reduce power consumption, it also exacerbates side effects which have generally been considered undesirable in photodetector circuits. Significant among these is the effect of parasitic capacitances in the photodetector, which is typically a phototransistor. The effects of these parasitic capacitances appear in the dynamic mode of the transistor, and increase in significance when the LED is pulsed. In most prior art circuits using phototransistors, the circuits are designed to minimize the parasitic capacitance, including the addition of circuitry to counteract its effects.

The most important parasitic capacitance is typically the parasitic base/collector capacitance, $C_{bc}$. The parasitic effects have generally been of even greater concern in pulsed LED systems. In at least some instances additional hardware has been used to compensate for the effects of these capacitances.

As explained in greater detail hereinafter, some methods for reducing power involve reducing the current required by the phototransistor by increasing the value of the load resistor. However, because of the effects of the parasitic capacitances, such increase in load can result in unacceptable inccreases in response time. Thus, the amount of power reduction which can be obtained by such methods is limited, and in at least some cases unacceptable.

One device in which such power reduction methods yield unacceptable results is the electronic mouse. One form of electronic mouse uses a plurality LED/phototransistor pairs to convert X-Y motion to a digital representation of distance. Typically, four LED/phototransistor pairs with their respective shutters are used to provide an accurate representation of the magnitude and direction of movement in the X-Y plane. The accuracy of the digital conversion is determined by the number of pulses generated per unit of distance traveled. For correct movement calculations, at least 4,000 samples per second (or about one every 250 microseconds) are needed when the mouse is moved at reasonable speeds. At these sampling rates, new methods are required for power reduction.

SUMMARY OF THE INVENTION

The present invention implements a variety of circuitry and methods to efficiently compensate for and/or use to advantage the parasitic capacitance characteristics of photodetectors such as phototransistors.

The present invention can take any of several embodiments, but each typically may be implemented by a low-cost photodetector and load with a single chip microprocessor or an application specific integrated circuit (ASIC).

In general, the various designs and methods of the present invention use the characteristics of a photodetector such as a phototransistor, including its parasitic capacitances, together with an active component to permit elimination of previously required parts as well as to lower the power required to be supplied to the LED for proper operation. More particularly, a switchable input/output port on a microprocessor can be used either alone or in combination with other designs to vary the power requirements of a photodetector circuit. The parasitic capacitance of the phototransistor can then be used alone or in combination with the switchable I/O port to yield an effective, short-term sample and hold circuit.

In addition, the charging characteristics of the parasitic capacitance can be used together with the analog light to time conversion characteristics of the phototransistor to create a digital hysteresis effect using only a microprocessor and selectively adjusting either LED on time or phototransistor sampling time. Further, the parasitic capacitance is used to permit use of unmatched, unadjusted LED/phototransistor pairs by use of selective timing of LED on-times or phototransistor sampling times. Finally, the present invention discloses a method of providing low power compensation for high threshold CMOS microprocessors which includes the use of a Zener diode in a charge pump configuration to precharge the parasitic capacitance.

It is therefore one object of the present invention to provide a device capable of using parasitic capacitances in a phototransistor to advantage in a photodetection circuit.

It is another advantage of the present invention to provide a method for implementing photodetection tasks conventionally done by hardware into microprocessor-based software.

It is a further object of the present invention to provide a design for lowering power requirements of an LED/photodetector pair.

It is yet another object of the present invention to provide efficient methodology for converting light impinging on a photodetector to an indicia such as time suitable for manipulation by a microprocessor.

These and other objects of the present invention will be better appreciated from the following Detailed Description of the Invention, in which:

FIG. 1 illustrates in schematic form a typical phototransistor and Schmitt trigger gating circuit;

FIGS. 2a, 2b, and 2c illustrate models of the phototransistor and associated emitter resistor under varying operating conditions;

FIGS. 5a-5b illustrate in flow diagram form two sampling programs for a third feature of the invention utilizing a microprocessor with no external hardware except the phototransistor and a load resistor to provide a digital hysteresis function.

DETAILED DESCRIPTION OF THE INVENTION

Figure 3A:
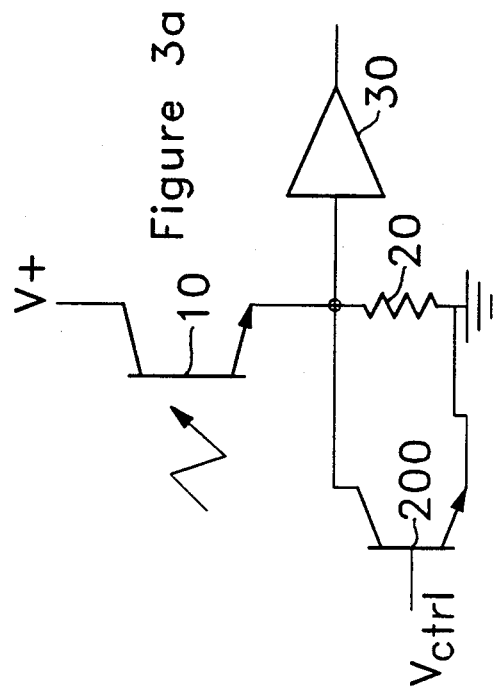
FIGS. 3a-3b illustrates in schematic form a first feature of the invention.

To better understand the advantages of the present invention, it will be helpful to review some of the fundamentals concerning phototransistors. Referring first to FIG. 1, there is shown a circuit including a photodetector 10 such as a phototransistor connected in an emitter follower arrangement, such that an emitter resistor 20 and a Schmitt trigger logic gate 30 are connected to the emitter of the transistor 10. The collector is connected to a suitable pull-up voltage, and the other side of the emitter resistor is connected to ground. A light source 40, such as an LED, is positioned to selectively illuminate the phototransistor 10.

During slow variations of the luminous intensity over time, the phototransistor is saturated, and the output voltage $V_e$ tracks the input luminous intensity, at least as a first approximation. Under these conditions, $$V_e = k_1 \cdot L \cdot R$$

where
$k_1$ = constant, dependent on the phototransistor;
L = Luminous intensity;
R = value of emitter resistor.
Luminous intensity may also be seen to be $$L = k_2 \cdot I_{led}$$

where
$k_2$ = constant;
$I_{led}$ = current in LED.
From this, the voltage at the emitter, $V_e$, can be seen to be $$V_e = k_1 k_2 I_{led} R$$

and $$I_{led} = k \cdot V_e / R$$

where $$k = 1/k_1 k_2.$$

Assuming that the input voltage to the logic gate 30 must rise to a threshold voltage $V_{th}$ to generate a logic signal, we get $$I_{ledMIN} = k \, V_{th}/R.$$

It follows that if power is to be reduced by reducing $I_{led}$, the only alternatives are to increase R or reduce $V_{th}$.

The difficulty with simply increasing R is that this approach is viable only for slow variations of luminous intensity. This results in large measure from the parasitic base/collector capacitance, $C_{bc}$. Thus, referring to FIGS. 2a-2c, the phototransistor 10 and emitter resistor 20 are modeled. The phototransistor can be approximately modeled, as shown in FIG. 2a, by a photodiode 100 through which a light-controlled current $I_d$ flows, arranged in parallel with the capacitor $C_{bc}$. The photodiode 100 and capacitor $C_{bc}$ are connected between the base and collector of a conventional transistor 110. The emitter resistor 20 is connected as in FIG. 1, and a current $I_{be}$ flows between the base and emitter of the transistor 110.

The model of FIG. 2a can be simplified to that shown in FIG. 2b, in which the photodiode 100 is represented as a light controlled current source 120, the parasitic capacitance $C_{bc}$ is enhanced by the amplification constant, B or beta, of the transistor to be $BC_{bc}$, and the transistor is simplified to a base-emitter diode 130. The other elements from FIG. 2a remain unchanged. A voltage $V_{bc}$ then exists across the capacitor $BC_{bc}$, another voltage $V_{be}$ exists across the diode 130, and a voltage $V_e$ exists across the emitter resistor 20. It will also be appreciated that the current $I_{ce}$ from the collector to the emitter is $BI_{be}$, where B is the usual current amplification constant of a transistor.

When the phototransistor is not receiving any light because the LED is powered off or the light from the LED is blocked by the mask, the dark phototransistor acts as a large capacitor, modeled in FIG. 2c. The value of the capacitor is essentially $BC_{bc}$. The circuit charges through the base/emitter junction and the resistor R, and charges in the usual exponential manner with the time constant RC. It can therefore be seen that increasing values of R result in slower charging of the parasitic capacitance. This results in slower operation of the phototransistor, where slow operation is likely to be unacceptable. In this type of arrangement, where sample rates on the order of 4,000 per second are desired, the emitter resistor 20 has a maximum value of about 5K ohms.

It will be appreciated that when the LED or other light source is lit, the capacitor $BC_{bc}$ is discharged and $V_e$ increases linearly with a slope approximately proportional to the luminous intensity, L, of the LED 40, based on the integration of light over time by the phototransistor 10. It will further be appreciated that this effect is independent of the value of the resistor 20 when the value of the resistor 20 is large, e.g., much larger than 1K ohm. By adding the logic gate 30 or other fixed threshold logic gate, a rudimentary "luminous intensity to time" converter is achieved which can be used to advantage by devices such as microprocessors or ASICs which can advantageously manipulate time information.

Although the foregoing analysis is given for an NPN phototransistor, a similar analysis is obviously valid for a PNP phototransistor arrangement. In addition, the analysis also applies to a common emitter amplifier configuration. In each case, various values of voltage or load may be adjusted in a manner which should be apparent to those with ordinary skill in the art.

Figure 3B:
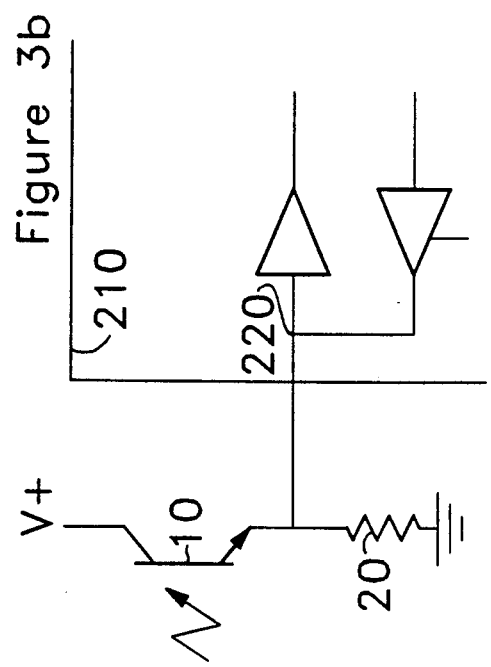

Given the foregoing limitations imposed by the existence of the parasitic capacitance $C_{bc}$, FIGS. 3a–3b illustrate one method for reducing the power supplied to the LED by altering the effective value of the emitter resistor 20. More particularly, FIG. 3a illustrates in schematic model form the phototransistor 10, emitter resistor 20 and follower gate 30, and in addition a controlled switching transistor 200 whose collector and emitter are connected in parallel with the emitter resistor 20. A control voltage $V_{ctrl}$ is supplied to the base of the transistor 200, and permits the transistor 200 to be switched on or off, thus substantially reducing the effective impedance at the emitter of the phototransistor 10 when the transistor 200 is on. This permits the value of emitter resistor 20 to be greatly increased, so long as $$R \cdot I_{cedark} << V_{th}$$

where
R = value of R20, and
$I_{cedark}$ = steady state $I_{ce}$ when the LED is off.

The arrangement shown in FIG. 3a can be implemented in a microprocessor 210 having input/output pins, such as pin 220, which are programmable to serve as either inputs or outputs. The low-resistance pull-down transistor 200 can be implemented by selecting the I/O pin 220 as an input during the on-time of the LED (resulting in a very high impedance at the emitter of the phototransistor, essentially equal to the value of resistor 20), and then switching the pin 220 to an output during the off time of the LED.

When the pin 220 is switched to an output and a control signal causes a 0 output, the pull down transistor 200 turns on, and the effective impedance at the emitter of the phototransistor 10 is very low. In this arrangement, the value of the resistor 20 is not greatly critical, and may be on the order of 100K ohms.

Figure 3C:
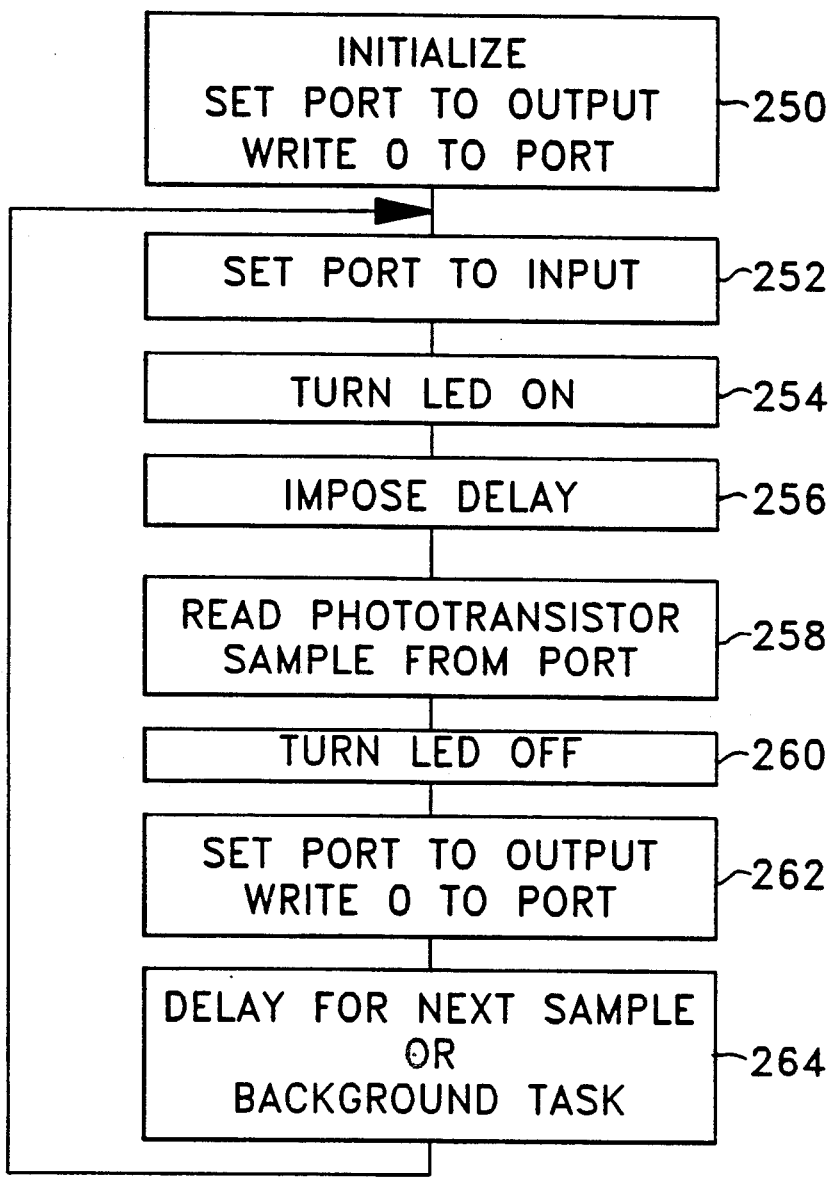
FIG. 3c illustrates in flow diagram form the operation of the embodiment shown in FIGS. 3a-b.

It will be appreciated by those skilled in the art that a more complex sampling routine will be required to be implemented in the microprocessor 210 for this arrangement, to ensure that the pull-down transistor is switched appropriately. A flow diagram for such a sampling program is shown in FIG. 3c. In FIG. 3c, the system is initialized in a conventional manner at a step 250, and initialization is configured to include setting the microprocessor I/O port associated with the pin 220 to an output as well as writing a 0 to the port.

At the appropriate time, as shown in step 252, the port is switched from an output to an input, followed by step 254 involving turning the LEDs on. This begins the integration in the phototransistor 10, and a delay is imposed at step 256 to permit the phototransistor adequate time to charge to $V_{th}$, if sufficient light is received. In the electronic mouse environment, a delay of 10–25 microseconds is usually sufficient. On the next instruction, step 258, the output of the phototransistor 10 is sampled, followed at step 260 by turning the LEDs off. The port is then switched back to being an output, and a 0 is written to the port, at step 262. Thereafter, suitable delay (which may be filled with other tasking) is imposed at step 264 to await the time for the next sample, and the program loops appropriately back to step 252.

The embodiment of FIG. 3a may also be implemented in an ASIC, simply by fabricating the pull-down transistor 200 and the emitter resistor 20 in the integrated circuit, together with the control signal for the transistor 200. Alternatively, the control signal may be incorporated into the ASIC and either the transistor 200, the resistor 20, or both may be external.

Figure 4:
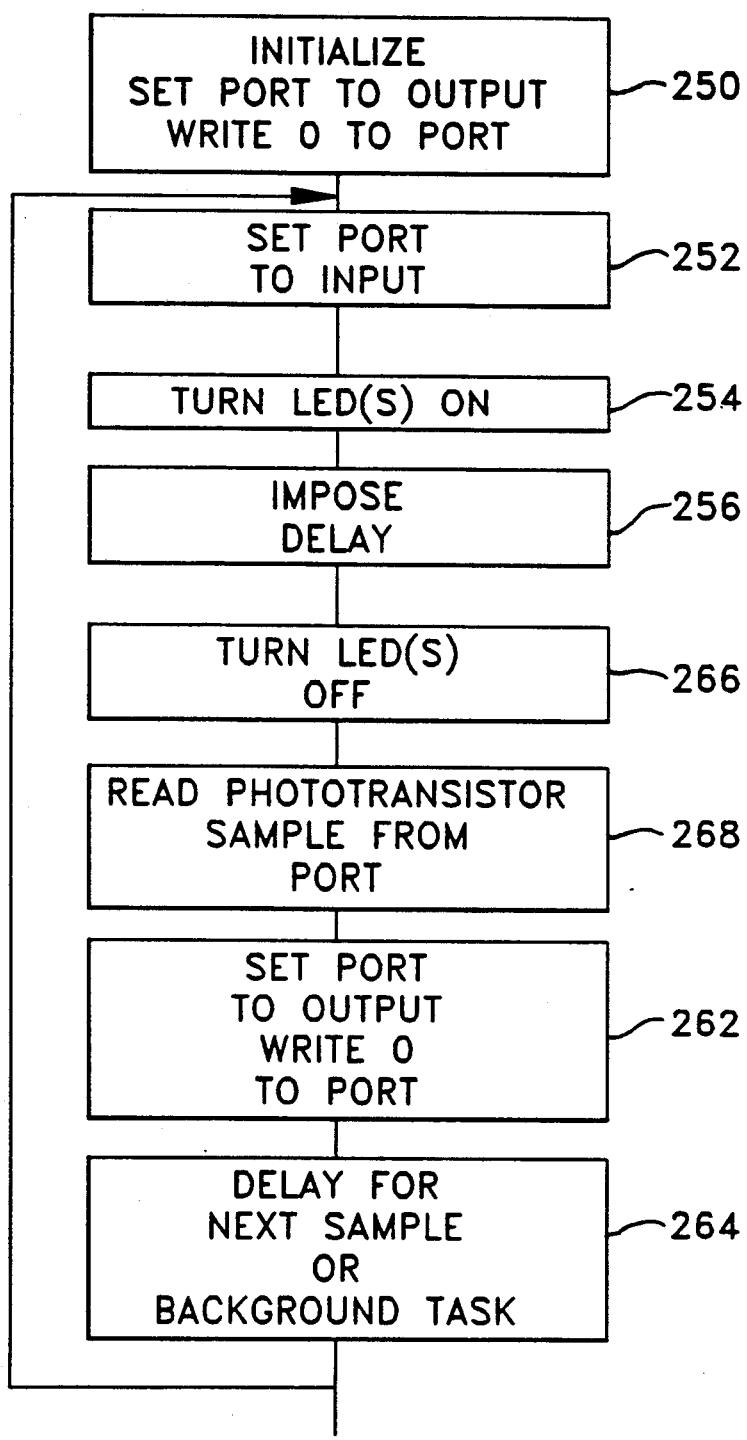
FIG. 4 illustrates in flow diagram form the method of a second feature of the invention involving use of the parasitic capacitance as a sample and hold circuit for power savings.

Referring next to FIG. 4, another feature of the present invention is shown in flow diagram form. The feature shown in FIG. 4, which involves a modification of the sampling program of FIG. 3c, involves using the parasitic capacitance of the phototransistor 210 as a short term memory, or a sample and hold circuit, as a means of saving power.

It will be appreciated that the sequential operation of microprocessors requires that the microprocessor cannot simultaneously control the LED (or LEDs) and sample the phototransistors. As a result, a typical prior art approach has been to sample the phototransistors, and on the next instruction extinguish the LEDs; this sequence is shown in FIG. 3c. The power used by the LEDs during that cycle is therefore lost.

With the feature of the invention shown in FIG. 4, the microprocessor 210 first stops the LEDs and then samples the phototransistors. More specifically, steps 258 and 260 shown in FIG. 3c are reversed in FIG. 4 and renumbered as steps 266 and 268, respectively. Because of the parasitic capacitances of the phototransistors, $V_e$ remains at substantially the same level for a few microseconds. This permits the microprocessor to sample the phototransistors on the next instruction following turning off the LEDs. Thereafter, and in accordance with the switched I/O port design of FIG. 3b, the microprocessor can set its port to output and fully charge $BC_{bc}$ for the next sample cycle.

Referring next to FIGS. 5a–b, another feature of the present invention is shown therein. FIGS. 5a–b illustrate in flow diagram form a method for creating a digital hysteresis circuit using a microprocessor or other suitable control means. As those skilled in the art will appreciate, under certain conditions the phototransistor can, at least as a first approximation, be simulated as a current source in parallel with the capacitor $C_{bc}$, as shown in FIG. 2b. In this mode the charging of the capacitor $C_{bc}$ causes a substantially linear increase in $V_e$ during LED on-time. This characteristic can be used in combination with a microprocessor or other suitable control circuit to create a digital hysteresis circuit.

More specifically, when the LEDs are switched on, luminous intensity increases to the on value in a substantial square wave. In response, the emitter voltage, $V_e$, of the phototransistor 10 increases substantially as a ramp function during LED on time.

In prior art analog hysteresis circuits, two different, closely spaced thresholds are used for rising and falling transitions. However, microprocessor inputs and digital ASICs typically have a single, fixed threshold.

Even where the microprocessor input port threshold is unique and fixed, with the present invention it remains possible to develop a digital hysteresis function by adjusting the LED on time, which is acceptable where only one LED and one phototransistor is used. This approach will be discussed in greater detail hereinafter in connection with FIG. 5a. Alternatively, where multiple LEDs and phototransistors are involved, hysteresis effects may be achieved by adjusting phototransistor sampling time, with LED on-time set to the longest period required to yield suitable sensitivity by any of the phototransistors. This approach will be discussed in greater detail below in connection with FIG. 5b.

This hysteresis may be created by programming a longer on time if the previous sample was a "1", and a shorter on time if the previous sample was a "0". Again, a more complex sampling function is required to take into account the state considerations. It should be noted that the hysteresis is dependent only on the clock precision and not on the analog characteristics of the port.

The first approach discussed above, of selecting different LED on times based on the value of the prior sample to create hysteresis, can be better appreciated with reference to FIG. 5a. FIG. 5a, which in its entirety can serve as a replacement for step 256 of FIG. 4, shows in block diagram form one approach to varying LED on time to create digital hysteresis. More specifically, in step 282 of FIG. 5a, the value of the previous sample is tested for whether it is a 1 or a 0. If the previous sample is a 0 a short delay period, defined as t, is imposed at step 284a. If the previous sample is a 1, a longer delay period defined as $t+t_{hys}$ is imposed at step 284b. The time $t_{hys}$ is defined as the time difference of the upper and lower hysteresis thresholds. The sequence then continues either with step 266 of FIG. 4 or the sequence depicted in FIG. 5a.

As noted above, the flow diagram of FIG. 5b may be preferred in applications using multiple LEDs and phototransistors, such as the four LED/phototransistor pairs (with interposed shutters) used in the Logitech C7 mouse. The steps shown in FIG. 5b may be integrated into the flow diagram of FIG. 4 by replacing steps 266 and 268 in FIG. 4 with those shown in FIG. 5b. More particularly, following the delay of step 256 of FIG. 4, a first sample is read (at a first time) in step 270 of FIG. 5b. A suitable delay is thereafter imposed in step 272 to establish the hysteresis. The delay imposed in step 272 may be adjusted for the delay inherent in subsequent processing steps. On the following instruction, in step 274, the LEDs are turned off (in accordance with the feature described in connection with FIG. 4, above), and a second sample is taken (at a time later than t) in step 276.

In step 278, the previous sample (established in the prior iteration, see the steps of FIG. 4) is tested to see whether it is a 1 or a 0. If the previous sample is a 0, it is replaced with the value of the first sample in step 280b. If the previous sample is a 1, it is replaced with the value of the second sample in step 280a. The previous sample thus is converted to a current sample which includes the hysteresis factor. The current sample is supplied at step 262 of FIG. 4, and upon looping back becomes the previous sample.

Figure 6:
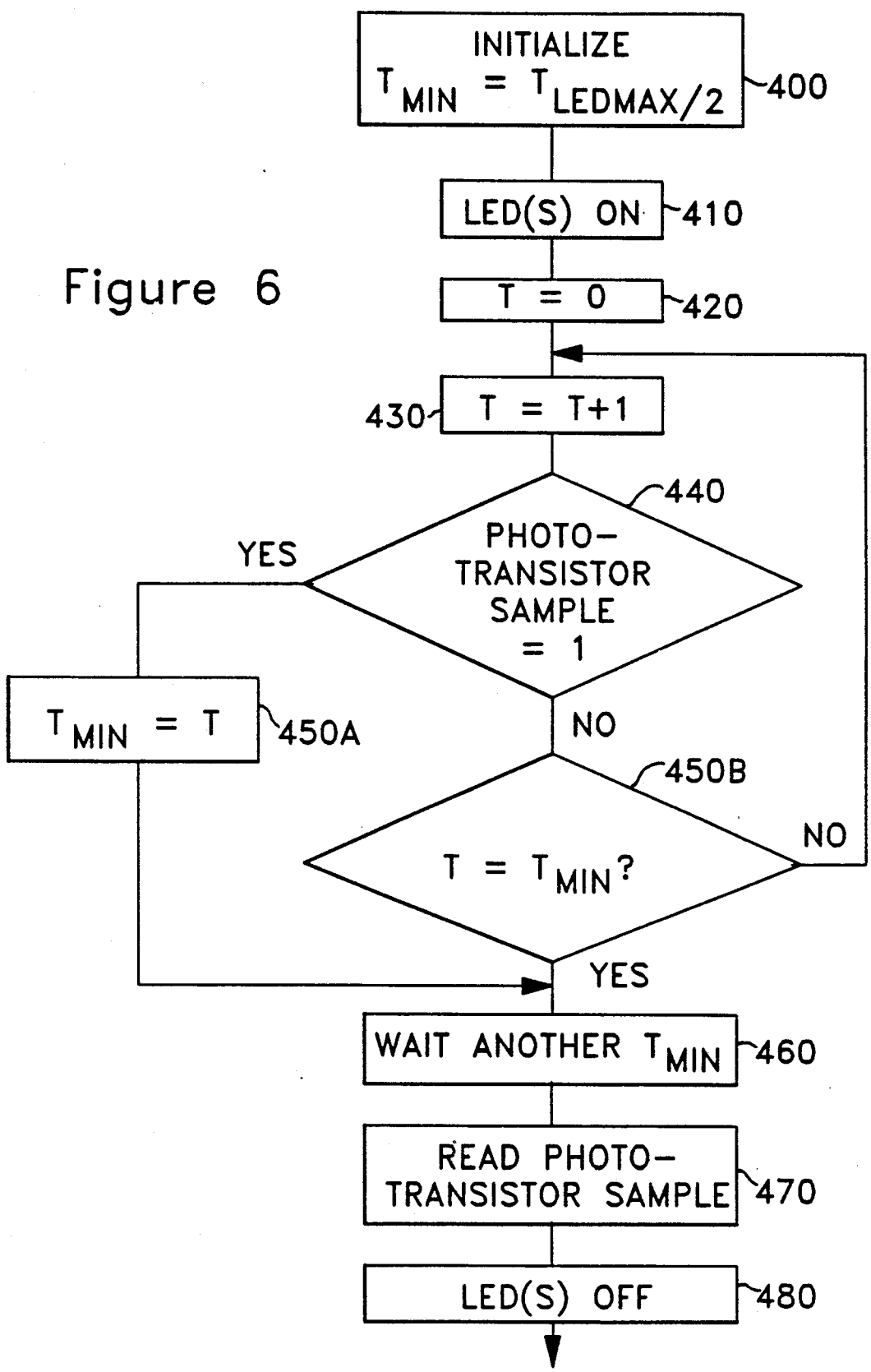
FIG. 6 illustrates in flow diagram form another sampling program for a fourth feature of the invention involving compensation for unmatched light source/photodetector pairs.
Figure 8:
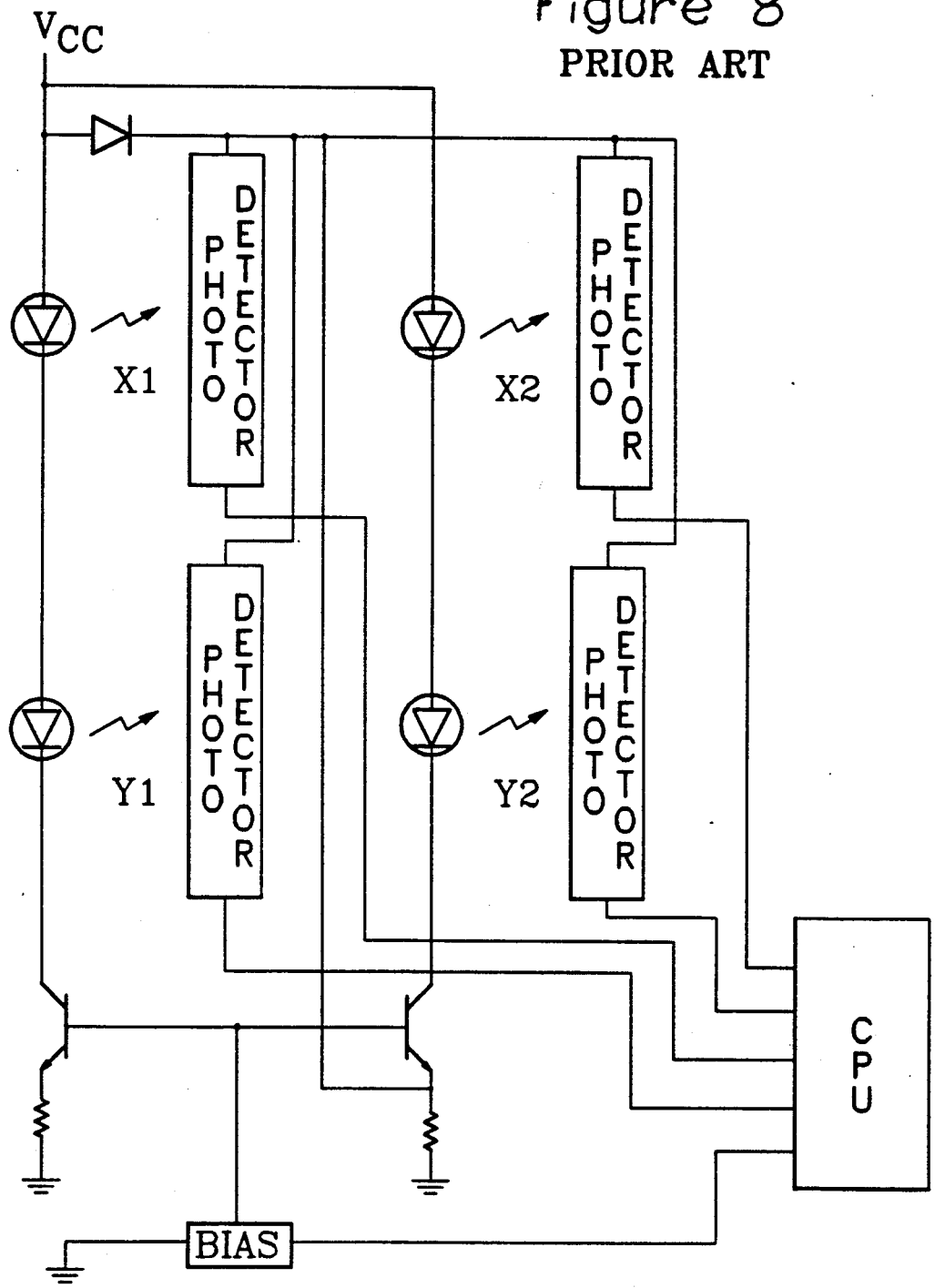
FIG. 8 illustrates in schematic form typical circuitry for an electronic mouse for use with the present invention.

Referring next to FIG. 6, yet another feature of the present invention is disclosed which permits the use of unadjusted, unmatched pairs of LEDs and phototransistors. By continuously measuring the time the phototransistor takes to make the digital 0 to 1 transition, the response of the LED phototransistor pair can be approximated. The transition time is a reasonable approximation of response due to the substantially linear increase of the phototransistor output voltage, $V_e$, during the illumination phase.

The linear increase of $V_e$ during illumination caused by the parasitic capacitance makes it possible to vary selectively the phototransistor sampling time to permit automatic adjustment or compensation for any aging, supply voltage change, or mechanical misalignment which may occur in the mouse or other optoelectronic device. This selective variation is controlled by a more complicated sampling program in the control microprocessor.

With reference to FIG. 6, one example of a suitable sampling program is shown in flow diagram form. FIG. 6 is a high level representation of the algorithm and the actual implementation on a specific microprocessor will require customization which should be apparent to those skilled in the art. Particularly important will be compensation for the delays inherent in performing the steps of the algorithm while still maintaining acceptable resolution.

As with FIG. 4, the first step 400 in the sampling program of FIG. 6 is to set a time value $T_{min}$ to $T_{LED-MAX}/2$, which is determined in advance by the worst case characteristics of an LED/phototransistor pair. In the context of an electronic mouse using LED/phototransistor pairs with shutters, $T_{LEDMAX}$ represents the maximum amount of time (or worst case) required for a phototransistor output to reach $V_{th}$ after the shutter permits light from the LED to reach the phototransistor.

On the next instruction, step 410, the LEDs are turned on. At step 420 a timer T is initialized to zero, and begins counting to measure time on the next instruction, or step 430.

After the time is measured, a phototransistor sample is taken at step 440 and tested to see whether it is a 0 or a 1. If the sample is a 1, $T_{min}$ is set to T in a step 450a and the program continues in step 460 as described below; if the phototransistor sample is a 0, the timer value T is compared $T_{min}$ in step 450b. It will be appreciated that in all but the worst case, the phototransistor sample will become a 1 before the value of T reaches $T_{min}$, since most of the LED/phototransistor pairs will be more sensitive than the worst case.

If the value T does not equal $T_{min}$, the program loops back to step 430 and permits the timer to increment and continue. Eventually, either the sample becomes a 1 or T reaches $T_{min}$. At that point, a delay equal to $T_{min}$ is imposed in step 460. This delay permits a full opening and closing of the shutter for the LED/phototransistor pair (or rotation of the segment of the shutter disk), bearing in mind that the initial $T_{min}$ was $T_{LEDMAX}/2$.

After the delay of step 460, a phototransistor sample may be taken in step 470, after which the LEDs can be turned off in step 480. It will be appreciated, given the foregoing discussion, that steps 470 and 480 may be changed to incorporate the other features of the invention described previously.

The operation of the algorithm shown in FIG. 6 may be better appreciated in connection with its application to electronic mice. In the environment of an electronic mouse, for example, the threshold may be set to half the maximum voltage with the shutter fully open, which translates into a sampling time that is twice the minimum 0 to 1 transition time for the phototransistor. Other multipliers, including fractional multipliers, of the minimum transition time have also been found acceptable, and in some instances multiples on the order of 2.5 to 3 have proven desirable although other multiples are acceptable in appropriate circumstances relating microprocessor cycle time and the desired number of samples.

For use of the arrangement of FIG. 6 in electronic mice, it will also be preferable to use a relatively fast processor to reduce resolution errors. Preferably, such microprocessors will have a cycle time of one microsecond or less. It will also be appreciated that the algorithm of FIG. 6 covers adjustment of only one LED/phototransistor pair, and must be expanded for use with multiple LED/photodetector pairs for many applications.

Figure 7:
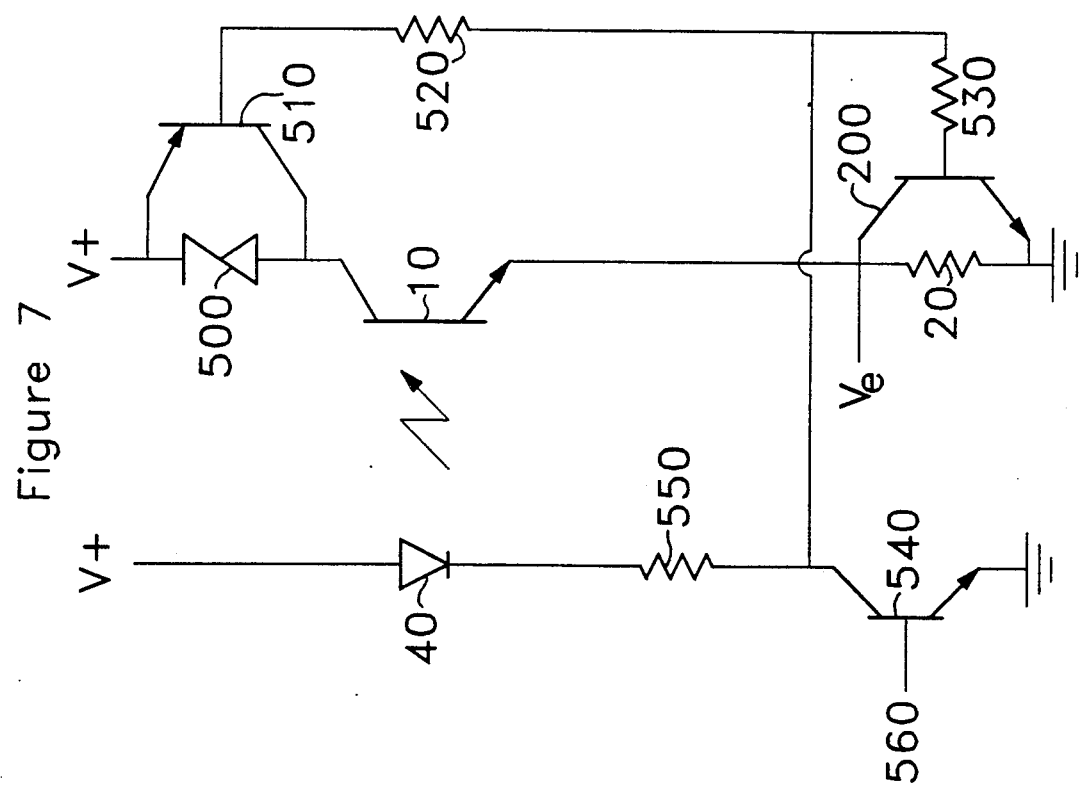
FIG. 7 illustrates in schematic form a fifth feature of the invention involving use of a charge pump to precharge the parasitic capacitance to save power.

Yet another feature of the present invention is shown in FIG. 7. The feature shown in FIG. 7 uses the parasitic capacitor to adapt for a high fixed threshold voltage $V_{th}$. More specifically, it will be appreciated from the prior discussion that power requirements are directly proportional to $V_{th}$. Ideally, threshold voltages are in the range of 500 mV, which permits low power but is sufficient to reject noise. However, CMOS microprocessors typically have a higher threshold, on the order of 2.5 volts, which can cause significant power loss.

To minimize power while still using a CMOS microprocessor, a variable offset voltage may be inserted in the collector of the phototransistor 10. During LED off time, the parasitic capacitor $BC_{bc}$ can be charged to a voltage to a selected voltage, for example $V_{th}-0.5$, instead of the supply voltage. The half-volt is selected as a suitable threshold for noise immunity, and may be readily adjusted depending upon the particular application.

The offset voltage may have two states, such that during LED on time, the voltage is zero, and during LED off time the voltage is the offset described above. The emitter voltage $V_e$ now starts at essentially any selected voltage and the higher threshold of CMOS microprocessors can be readily compensated.

The foregoing operation may be better appreciated from FIG. 7, in which the phototransistor 10 and corresponding LED 40 of FIG. 3a are shown, as are the load resistor 20 and pull down transistor 200. The output of the system continues to be taken at the emitter of the phototransistor 10. Between the collector of the phototransistor 10 and the supply voltage V+ is connected a zener diode 500, which is shunted by the collector-emitter connection of a PNP transistor 510. A resistor 520 provides base drive to the transistor 510, and a resistor 530 provides base drive to the transistor 200.

A transistor 540 is connected at its collector to a pull-up resistor 550, and then to the LED 40. The junction of the collector of the transistor 540 and resistor 550 is also connected to the common connection of the resistors 520 and 530 so that the LED control signal 560 applied to the base of the transistor 540 also controls the state of the transistors 200 and 510.

When the transistor 540 is off, the LED is also off and the parasitic capacitance of the phototransistor 10 would normally charge to the supply voltage, V+. However, because of the zener diode 500, the voltage across the diode 500 is about $V_{th}-0.5$. During this period, the transistor 200 is conducting and the transistor 510 is cut off.

When the transistor 540 switches on, the LED turns on, the transistor 200 is cut off and the transistor 510 turns on. Because of the zener 500, parasitic capacitance represented as $BC_{bc}$ acts as a charge pump and the emitter voltage $V_e$ starts at a voltage higher than 0 volts. Again, this offset may be selected to compensate for the high input threshold of the microprocessor, such that, for example, the normal 2.5 volt threshold of a CMOS microprocessor can be adjusted to be one-half volt or other selected value.

It will be appreciated by those skilled in the art that each of the foregoing features of the present invention may be used alone or in combination with the others. Thus, in the environment of an electronic mouse, all of the foregoing features may be combined to yield an extremely efficient low power mouse. In each case, the trade-off is between lower power and greater complexity in either the sampling routine of a microprocessor or the circuitry of an ASIC.

Having fully described various embodiments of the present invention, numerous alternatives and equivalents which do not depart from the invention will be apparent to those skilled in the art. It is therefore intended that the invention not be limited by the foregoing description, but only by the appended claims.

What is claimed is:

1. A circuit comprising
    an LED,
    a phototransistor having parasitic capacitances, the LED and phototransistor being arranged so that light from the LED impinges on the phototransistor when the LED is on,
    means for switching the LED on and off,
    offset voltage means connected to the collector of the phototransistor for imposing an offset voltage,
    load means connected to the emitter of the phototransistor for loading the phototransistor,
    first switchable means having high impedance and low impedance states connected in parallel with the offset voltage means for selectively shunting the offset voltage means, and
    wherein the first switchable means is switched to the low impedance state when the LED is on, and the first switchable means is switched to the high impedance state when the LED is off.

2. The invention of claim 1 further including
    second switchable means having high impedance and low impedance states connected in parallel with the load means for selectively shunting the load means,
    and the second switchable means is switched to the high impedance state when the LED is on, and the second switchable means is switched to the low impedance state when the LED is off.

* * * * *